(12) United States Patent
Fujiwara

(10) Patent No.: US 11,342,521 B2
(45) Date of Patent: May 24, 2022

(54) DISPLAY DEVICE AND METHOD FOR MANUFACTURING DISPLAY DEVICE

(71) Applicant: SHARP KABUSHIKI KAISHA, Sakai (JP)

(72) Inventor: Masaki Fujiwara, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 148 days.

(21) Appl. No.: 16/964,166

(22) PCT Filed: Jan. 29, 2018

(86) PCT No.: PCT/JP2018/002773
§ 371 (c)(1),
(2) Date: Jul. 22, 2020

(87) PCT Pub. No.: WO2019/146115
PCT Pub. Date: Aug. 1, 2019

(65) Prior Publication Data
US 2021/0036246 A1 Feb. 4, 2021

(51) Int. Cl.
*H01L 51/00* (2006.01)
*H01L 27/32* (2006.01)
*H01L 51/56* (2006.01)

(52) U.S. Cl.
CPC ...... *H01L 51/0097* (2013.01); *H01L 27/3244* (2013.01); *H01L 51/003* (2013.01); *H01L 51/56* (2013.01); *H01L 2227/326* (2013.01); *H01L 2251/5338* (2013.01)

(58) Field of Classification Search
None
See application file for complete search history.

(56) References Cited

U.S. PATENT DOCUMENTS

| | | | |
|---|---|---|---|
| 9,553,280 B2* | 1/2017 | Seo | H01L 51/0097 |
| 2016/0056217 A1* | 2/2016 | Yu | B32B 17/10504 |
| | | | 438/23 |
| 2019/0131551 A1* | 5/2019 | Xie | H01L 27/3262 |
| 2020/0043382 A1* | 2/2020 | Isa | G06F 3/044 |

FOREIGN PATENT DOCUMENTS

JP 2010-108559 A 5/2010

* cited by examiner

Primary Examiner — J. E. Schoenholtz
(74) Attorney, Agent, or Firm — ScienBiziP, P.C.

(57) ABSTRACT

A display device includes a support material on which a display area, a terminal, and a folding area are disposed. The display area includes a TFT and a light-emitting device layer. The display device includes: a first resin layer and a second resin layer extending along the display area, the terminal, and the folding area; and an organic SOG film provided between the first resin layer and the second resin layer, and laid through the folding area.

9 Claims, 8 Drawing Sheets

DISPLAY DEVICE AND METHOD FOR MANUFACTURING DISPLAY DEVICE

TECHNICAL FIELD

The disclosure relates to a display device and a method for manufacturing the display device.

BACKGROUND ART

Patent Document 1 discloses a method for manufacturing a magnetic storage medium. The method involves forming on a protective layer a spin-on-glass (SOG) film acting as a release layer, and removing the SOG film with a solvent.

CITATION LIST

Patent Literature

[Patent Document 1] Japanese Unexamined Patent Application Publication No. 2010-108559 (published on May 13, 2010)

SUMMARY

Technical Problem

In the method for manufacturing the magnetic storage medium disclosed in Patent Document 1, the magnetic storage medium is not expected to be folded.

The disclosure relates to a display device including, on a support material, a display area, a terminal, and a folding area provided between the display area and the terminal. Considered is a case where, for example, an inorganic film is provided between a first resin layer and a second resin layer in the folding area. In this case, the inorganic film might unfortunately crack when the folding area is folded.

The disclosure is intended to prevent or reduce the risk of a crack caused in a film provided between the first resin layer and the second resin layer in the folding area when the folding area of the display device is folded.

Solution to Problem

A display device according to an aspect of the disclosure includes: a flexible support material on which a display area, a terminal, and a folding area are disposed, the display area including a TFT layer and a light-emitting device layer provided above the TFT layer, the folding area provided between the display area and the terminal; a first resin layer and a second resin layer extending along the display area, the terminal, and the folding area; and an organic spin-on-glass (SOG) film provided between the first resin layer and the second resin layer, and laid through the folding area. The second resin layer is provided above the first resin layer, and the TFT layer is provided above the second resin layer.

In a method for manufacturing a display device according to an aspect of the disclosure, the display device includes a flexible support material on which a display area, a terminal, and a folding area are disposed, the display area including a TFT layer and a light-emitting device layer provided above the TFT layer, the folding area provided between the display area and the terminal. The method includes: forming a first resin layer, an organic SOG film, and a second resin layer on a mother substrate such that the first resin layer, the organic SOG film, and the second resin layer are stacked in the order of the first resin layer, the organic SOG film, and the second resin layer with respect to the mother substrate; forming the TFT layer above the second resin layer; forming the light-emitting device layer above the TFT layer; removing the mother substrate from the first resin layer; and attaching the support material to the first resin layer. The first resin layer and the second resin layer extend along the display area, the terminal, and the folding area, and the organic SOG film is laid through the folding area.

Advantageous Effects of Disclosure

According to an aspect of the disclosure, it is possible to prevent or reduce the risk of a crack caused in a film provided between the first resin layer and the second resin layer in the folding area when the folding area of the display device is folded.

DESCRIPTION OF EMBODIMENTS

Figure 1:
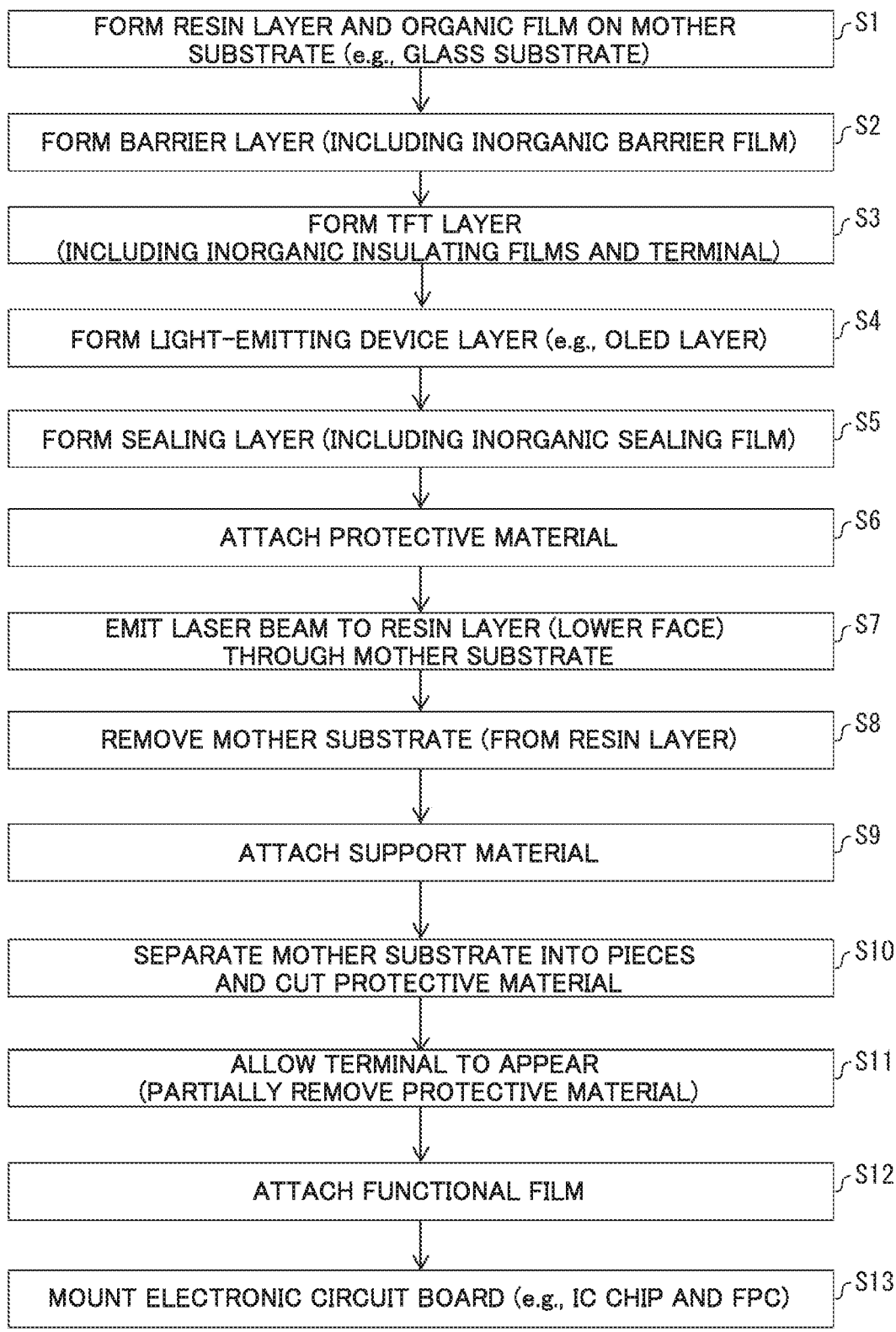
FIG. 1 is a flowchart showing an example of a method for manufacturing a display device.

FIG. 1 is a flowchart showing an example of a method for manufacturing a display device 2. FIG. 2(a) is a cross-sectional view illustrating a configuration example of the display device 2 in a manufacturing process, and FIG. 2(b) is a cross-sectional view illustrating a configuration example of the display device 2. In the description below, the term "upper layer (or layer above)" means that a constituent feature is formed in a successive process after a comparative layer. The display device 2 is a flexible display. In the method for manufacturing the display device 2 according to an aspect of the disclosure, Step S1 below in particular is a feature of the disclosure. Details of Step S1 will be described later.

Figure 2:
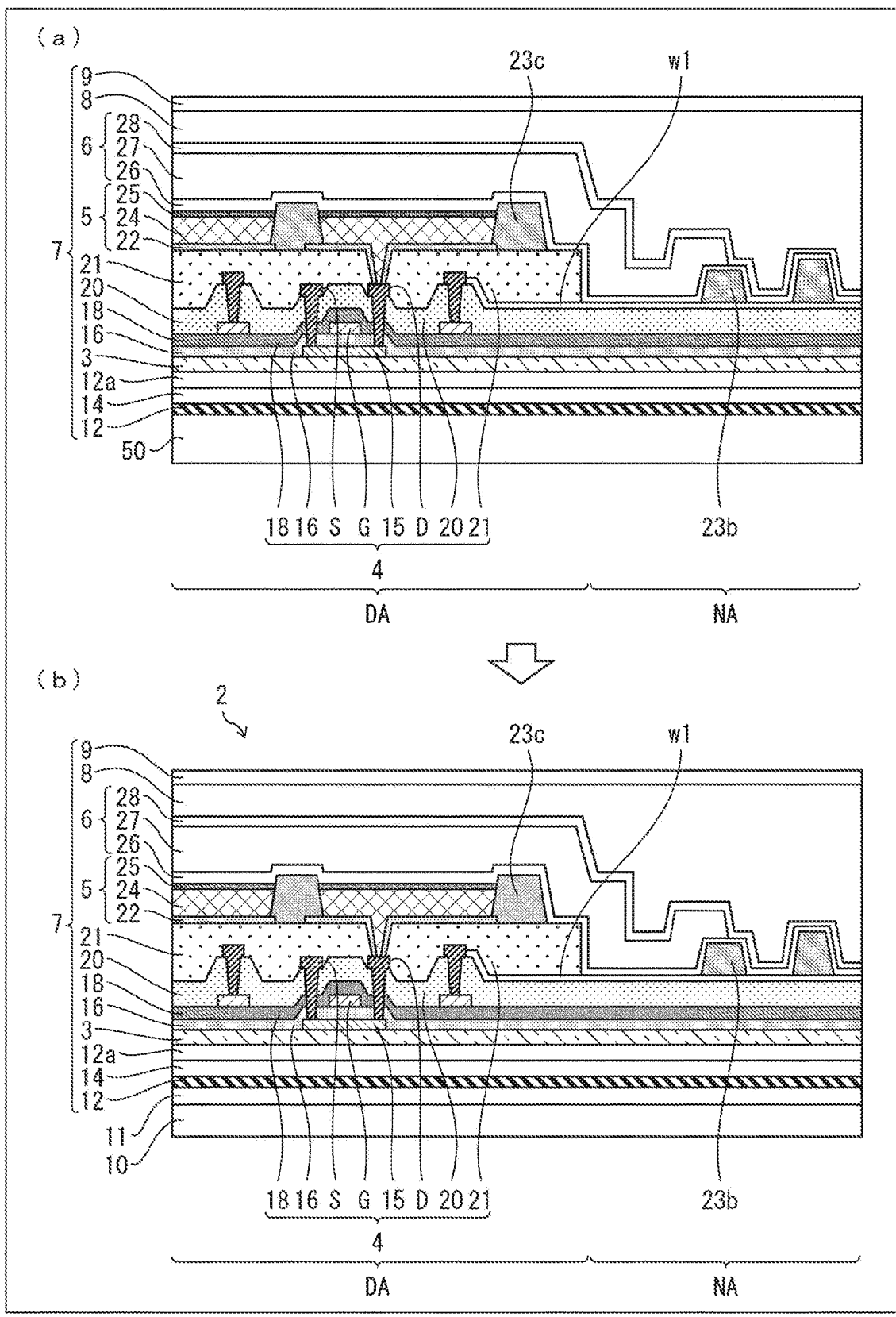
FIG. 2(a) is a cross-sectional view illustrating a configuration example of the display device in a manufacturing process.
FIG. 2(b) is a cross-sectional view illustrating a configuration example of the display device.

In manufacturing the flexible display device 2, first, as shown in FIGS. 1 and 2, resin layers and an organic spin-on-glass (SOG) film 14 are formed on a translucent mother substrate (e.g., a glass substrate) 50 (Step S1: applying a first resin layer, applying an organic SOG film, and applying a second resin layer). Specifically, a first resin layer 12 is applied on the mother substrate 50, and then, the organic SOG film 14 is applied on the first resin layer 12. Moreover, after the organic SOG film 14 is applied, a second resin layer 12a is applied on the organic SOG film 14. Note that, in Step S1, the organic SOG film 14 may be applied across a top face of the first resin layer 12 or the organic SOG film 14 may be applied to lie out of the top face of the first resin layer.

After the second resin layer 12a is formed, an inorganic barrier film 3 (a barrier layer) is formed on the second resin layer 12a (Step S2). After the inorganic barrier film 3 is formed, a thin-film transistor (TFT) layer 4 is formed (Step S3: forming a TFT layer). The TFT layer 4 includes: inorganic insulating films 16, 18, and 20; and a planarization film 21. After the TFT layer 4 is formed, a light-emitting device layer (e.g., an organic light-emitting-diode (OLED) device layer) 5 is formed (Step S4: forming a light-emitting device layer). After the light-emitting device layer 5 is formed, a sealing layer 6 is formed (Step S5). The sealing layer 6 includes: inorganic sealing films 26 and 28 and an organic sealing film 27. After the sealing layer 6 is formed, a protective material 9 (e.g., a PET film) is attached to the sealing layer 6 through a bonding layer 8.

Then, a laser beam is emitted to the first resin layer 12 (a lower face) through the mother substrate 50 (Step S7). The laser beam is emitted to the first resin layer 12 through the mother substrate 50, so that the mother substrate 50 is removed from the first resin layer 12 (Step S8: removing a mother substrate). Hence, the mother substrate 50 and a stack 7 illustrated in FIG. 2(a) separate from each other. Here, the stack 7 is an entire multilayer body formed on the mother substrate 50. In the example illustrated in FIG. 2(a), the stack 7 includes layers, formed on the mother substrate 50, between the first resin layer 12 and an outermost layer; namely, the protective material 9. Note that Steps S7 and S8 are steps related to so-called laser-lift-off (LLO).

Figure 3:
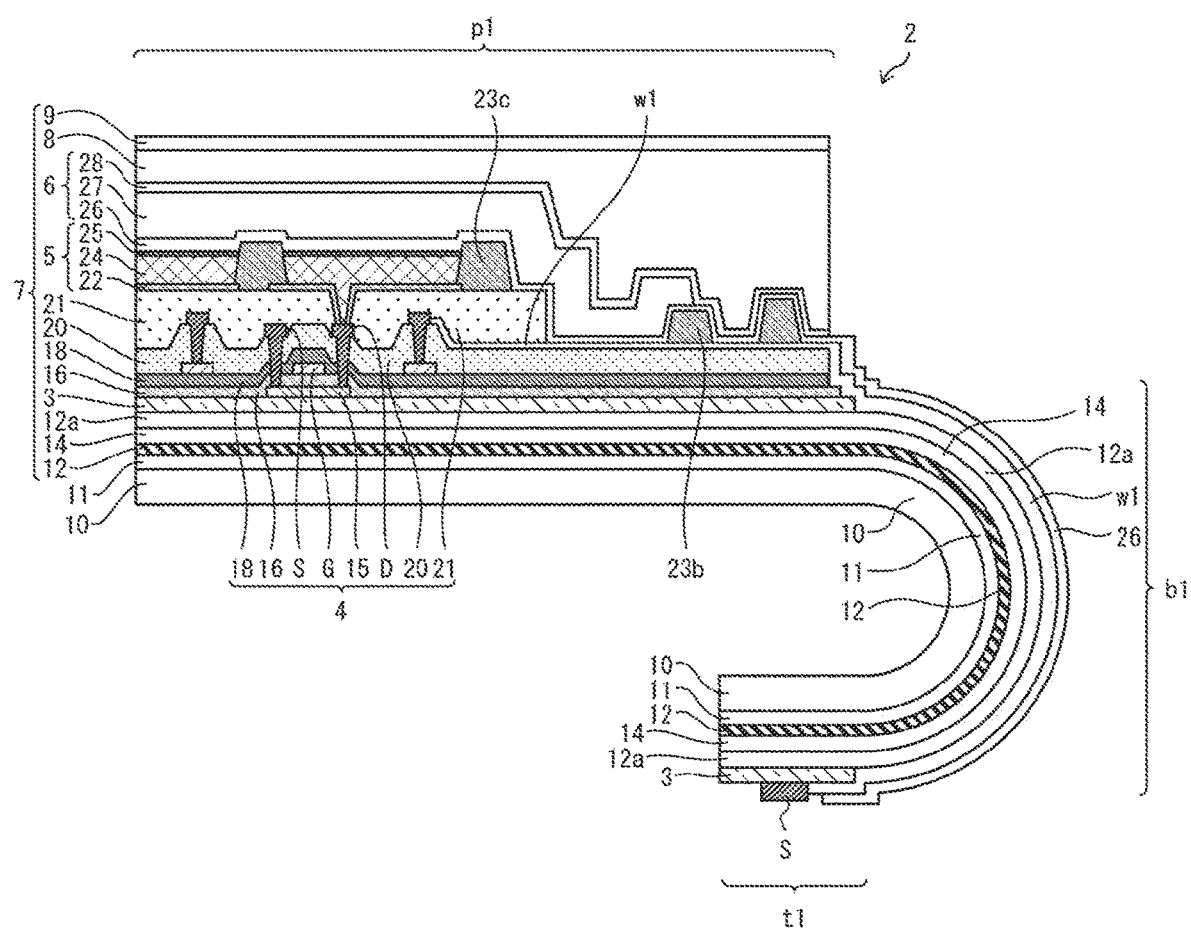
FIG. 3 is a cross-sectional view illustrating a configuration example of a display device according to a first embodiment of the disclosure.

Then, as illustrated in FIG. 2(b), a support material 10 (e.g., a PET film) is attached to the lower face of the first resin layer 12 through a bonding layer 11 (Step S9: attaching a support material). After the support material 10 is attached to the lower face of the first resin layer 12 through the bonding layer 11, the mother substrate 50 is separated and the protective material 9 is cut. Hence, a plurality of display devices are cut out (Step S10). After the display devices are cut out, the protective material 9 above a terminal of the TFT layer 4 is removed so that the terminal appears (Step S11). Hence, the display device 2 illustrated in FIG. 2(b) is obtained. Then, a functional film (not-shown) is attached (Step S12), and using an ACF, for example, an electronic circuit board is mounted on the terminal (Step S13). Specifically, as illustrated in FIG. 3, the terminal of the TFT layer 4 in a display area p1 is connected to a source electrode S of a terminal t1 through a terminal wire w1, so that the electronic circuit board is mounted on the source electrode S of the terminal t1. Note that each of the steps described above is carried out by a manufacturing apparatus of the display device.

Note that, in FIG. 2(a) and FIG. 2(b), the reference sign 4 denotes the TFT layer, the reference sign 15 denotes a semiconductor film, the reference sign 16 denotes the inorganic insulating film (gate insulating film), the reference sign 22 denotes an anode electrode, the reference sign 23b denotes a bank, the reference sign 23c denotes a partition wall, the reference sign 24 denotes an electroluminescence (EL) layer, the reference sign 25 denotes a cathode electrode, the reference sign 26 denotes the inorganic sealing film, the reference sign 27 denotes the organic sealing film, the reference sign 28 denotes the inorganic sealing film, the reference sign G denotes a gate electrode, the reference sign S denotes a source electrode, the reference sign D denotes a drain electrode, the reference sign DA denotes an active area, and the reference sign NA denotes an inactive area.

Moreover, the active area DA corresponds to an area in which the light-emitting device layer 5 is formed (an area in which the semiconductor film 15, the gate electrode G, the source electrode S, and the drain electrode D are formed). Meanwhile, the inactive area NA corresponds to an area included in the display area p1 except for the active area DA. In the inactive area NA, a terminal used for connecting to the terminal wire w1 is formed.

Examples of materials of the first resin layer 12 and the second resin layer 12a include polyimide, epoxy, and polyamide. In particular, polyimide is preferably used in view of heat resistance, low linear expansion coefficient, and resilience. Preferably, the first resin layer 12 is the same in material as the second resin layer 12a. Hence, the first resin layer 12 and the second resin layer 12a can be the same in resilience and heat resistance. Since the first resin layer 12 and the second resin layer 12a can have uniform curvature and heat conductivity, the organic SOG film 14 provided between the first resin layer 12 and the second resin layer 12a is less likely to crack. The second resin layer 12a is provided above the first resin layer 12.

While the display device is in use, the inorganic barrier film 3 prevents water and/or an impurity from reaching the TFT layer 4 and/or the light-emitting device layer 5. The inorganic barrier film 3 is formed by, for example, the chemical vapor deposition (CVD). The inorganic barrier film 3 can include, for example, a silicon oxide film, a silicon nitride film, or a silicon oxide nitride film. Alternatively, the inorganic barrier film 3 can include a multilayer film including these films. The inorganic barrier film 3 has a thickness of, for example, 50 to 1,500 nm.

The TFT layer 4 includes: the semiconductor film 15; the inorganic insulating film (gate insulating film) 16; the gate electrode G; the inorganic insulating films 18 and 20; the source electrode S; the drain electrode D; and the planarization film 21. The TFT layer 4 is provided above the second resin layer 12a. The inorganic insulating film 16 is formed above the semiconductor film 15, and the gate electrode G is formed above the inorganic insulating film 16. The inorganic insulating films 18 and 20 are formed above the gate electrode G. The source electrode S and the drain electrode D are formed above the inorganic insulating film 20. The planarization film 21 is formed above the source electrode S and the drain electrode D.

The semiconductor film 15, the inorganic insulating film 16, the gate electrode G, the inorganic insulating film 18 and 20, the source electrode S, and the drain electrode D constitute a thin-film transistor. The TFT layer 4 has an end (the inactive area NA) provided with a plurality of terminals used to connect to the terminal wire w1. These terminals are connected to the source electrode S of the terminal t1 through the terminal wire w1. Connected to the source electrode S of the terminal t1 is an electronic circuit board such as an IC chip or an FPC.

The semiconductor film 15 includes, for example, a low-temperature polysilicon (LPTS) or an oxide semiconductor. The inorganic insulating film 16 can include a silicon oxide (SiOx) film, or a silicon nitride (SiNx) film formed by, for example, the CVD. Alternatively, the inorganic insulating film 16 can include a multilayer film including these films. The gate electrode G, the source electrode S, the drain electrode D, and the terminals include a monolayer film made of at least one of such metals as aluminum (Al), tungsten (W), molybdenum (Mo), tantalum (Ta), chromium (Cr), titanium (Ti), and copper (Cu), or a multilayer film including these metals. Note that, in FIG. 2, the TFT is of a top-gate structure, using the semiconductor film 15 as a channel. Alternatively, the TFT may be of a bottom-gate structure (when, for example, the channel of the TFT is an oxide semiconductor).

The inorganic insulating films 18 and 20 can include a silicon oxide (SiOx) film, or a silicon nitride (SiNx) film formed by, for example, the CVD. Alternatively, the inorganic insulating films 18 and 20 can include a multilayer film including these films. The planarization film 21 is an organic insulating film, and includes, for example, an applicable and photosensitive organic material such as polyimide and acrylic.

The light-emitting device layer 5 (e.g., an organic light-emitting-diode layer) includes: the anode electrode 22; the partition wall 23c; the bank 23b; the EL layer 24; and the cathode electrode 25. The anode electrode 22 is formed above the planarization film 21. The partition wall 23c defines a sub pixel in the active area DA. The bank 23b is formed in the inactive area NA. The EL layer 24 is formed above the anode electrode 22. The cathode electrode 25 is formed above the EL layer 24. The anode electrode 22, the EL layer 24, and the cathode electrode 25 constitute a light-emitting device (e.g., an organic light-emitting diode).

The partition wall 23c and the bank 23b can be formed, for example, in the same step, using an applicable and photosensitive organic material such as polyimide, epoxy, and acrylic. The bank 23b in the inactive area NA is formed on the inorganic insulating film 20. The bank 23b defines an edge of the organic sealing film 27.

The EL layer 24 is formed by vapor deposition or an ink-jet technique in an area (a sub-pixel area) surrounded by the partition wall 23c. If the light-emitting device layer 5 is an organic light-emitting-diode (OLED) layer, the EL layer 24 includes, for example, a hole-injection layer, a hole-transport layer, a light-emitting layer, an electron-transport layer, and an electron-injection layer stacked on top of another from below.

The anode electrode (a positive electrode) 22 is a stack of, for example, indium tin oxide (ITO) and an alloy containing Ag. The anode electrode 22 reflects light. The cathode electrode 25 can include a transparent metal such as ITO, or indium zinc oxide (IZO).

If the light-emitting device layer 5 is an OLED layer, a drive current between the anode 22 and the cathode 25 recombines holes and electrons together in the EL layer 24. The recombination causes an exciton which falls to the ground state, thereby emitting light.

The light-emitting device layer 5 does not have to be limited to include an OLED device. Alternatively, the light-emitting device layer 5 may include an inorganic light-emitting diode or a quantum-dot light-emitting diode. The light-emitting device layer 5 is provided above the TFT layer 4.

The sealing layer 6 includes: the inorganic sealing film 26 covering the partition wall 23c and the cathode electrode 25; the organic sealing film 27 covering the inorganic sealing film 26; and the inorganic sealing film 28 covering the organic sealing film 27.

Each of the inorganic sealing films 26 and 28 can include a silicon oxide film, a silicon nitride film, or a silicon oxide nitride film formed by, for example the CVD. Alternatively, each of the inorganic sealing films 26 and 28 can include a multilayer film including these films. The organic sealing film 27 is a translucent organic film thicker than the inorganic sealing films 26 and 28. The organic sealing film 27 can include an applicable organic material such as polyimide and acrylic. For example, ink including such a material is applied on the inorganic sealing film 26 by an ink-jet technique. Then, the ink is cured with application of an ultraviolet ray. The sealing layer 6 covers the light-emitting device 5 to prevent such foreign objects as water and oxygen from penetrating into the light-emitting device layer 5.

The protective material 9 is attached to the sealing layer 6 through the bonding layer 8, and functions as a support material in removing the mother substrate 50. The protective material 9 is made of, for example, polyethylene terephthalate (PET).

The support material 10 is attached to the lower face of the first resin layer 12 after the mother substrate 50 is removed, so that the display device to be produced excels in flexibility. The support material 10 may be made of, for example, PET. The support material 10 is flexible.

The functional film has such functions as optical compensation, touch sensing, and/or protection. The electronic circuit board is, for example, an IC chip or a flexible printed board mounted on a plurality of terminals TM.

First Embodiment

Described below is Step S1 which is a feature of the disclosure. FIG. 3 is a cross-sectional view illustrating a configuration example of the display device 2 according to a first embodiment of the disclosure. In Step 1, on the mother substrate 50, the first resin layer 12, the organic SOG film 14, and the second resin layer 12a are stacked and formed on top of another in stated order. In Step 1, the first resin layer 12, the organic SOG film 14, and the second resin layer 12a are formed so that the display device 2 has a structure as illustrated in FIG. 3.

As illustrated in FIG. 3, the display device 2 includes the support material 10. Disposed on the support material 10 are: the display area p1, the terminal t1, and the folding area b1 provided between the display area p1 and the terminal t1. The folding area b1 includes folded portions of the support material 10, the bonding layer 11, the first resin layer 12, the organic SOG film 14, the second resin layer 12a, the terminal wire w1, and the inorganic sealing film 26.

Moreover, the folding area b1 is expected to be folded 180°. Here, the folding area b1 is folded so that the display area p1 toward the protective material 9 and the terminal t1 toward the inorganic insulating film 20 face opposite directions. Specifically, the folding area b1 is folded so that the support material 10 faces inward in the folded portion.

In the display device 2, the display area p1 displays an image, and includes the stack 7. The display area p1 includes: the TFT layer 4; and the light-emitting device layer 5 provided above the TFT layer 4. In the display device 2, the terminal t1 connects to the electronic circuit board. The terminal t1 is a portion of the display device 2 except the display area p1 and the folding area b1. Specifically, the terminal t1 includes portions of: the first resin layer 12; the organic SOG film 14; the second resin layer 12a; the inorganic barrier film 3; and the source electrode S.

The terminal wire w1 connects the TFT layer 4 in the display area p1 and the source electrode S of the terminal t1 together. Note that although the planarization film 21 is provided in the display area p1 alone, the planarization film 21 may also be provided in the folding area b1.

The first resin layer 12, the organic SOG film 14, and the second resin layer 12a extend along the display area p1, the terminal t1, and the folding area b1. The organic SOG film 14 is provided through the folding area b1 between the first resin layer 12 and the second resin layer 12a. The organic SOG film 14 extends along the display area p1, the terminal t1, and the folding area b1, so that the display area p1, the terminal t1, and the folding area b1 can be entirely kept from moisture.

A film provided between the first resin layer 12 and the second resin layer 12a is likely to crack. The crack is specifically described below. Force (stress) generated by the bend is a bending moment. The bending moment is determined by a distance from the center of the folded portion and a coefficient of elasticity (Young's modulus) of the material of the folded portion. Moreover, the center is determined by a relationship between the coefficient of elasticity and a thickness of each of the layers included in the folded portion. The support material 10 is sufficiently thicker than any other film in the folded portion, and thus significantly affects the position of the center.

The most preferable technique to prevent or reduce a crack in the folded portion is to determine the coefficient of elasticity and the thickness of each layer in the folded portion so that the center of the folded portion is positioned in the terminal wire w1. The technique can prevent or reduce a crack in the folded portion, thereby reducing malfunction of the terminal wire w1.

Here, when the folding area b1 is folded, a film provided between the first resin layer 12 and the second resin layer 12a is located inward. Hence, this film receives great compression force to crack, and the cracked portion often comes off the film. In particular, the first resin layer 12 and the second resin layer 12a have a typical coefficient of elasticity of 5 to 11 GPa which is smaller than the coefficient of elasticity (100 to 500 GPa) of the film provided between the first resin layer 12 and the second resin layer 12a. Hence, the first resin layer 12 and the second resin layer 12a are susceptible to deformation, and the film therebetween is likely to be broken. Note that, in the folding area b1, the support material 10 may be omitted.

Hence, the organic SOG film 14, which is flexible, is provided as the film between the first resin layer 12 and the second resin layer 12a, thereby achieving the advantageous effects as follows. That is, when the folding area b1 is folded, the crack is prevented or reduced in the organic SOG film 14 provided between the first resin layer 12 and the second resin layer 12a in the folding area b1.

The technique can prevent or reduce a crack in the organic SOG film 14, making it possible to prevent or reduce stress to be applied to the terminal wire w1.

Hence, the terminal wire w1 is kept from being broken, reducing generation of electromigration. The organic SOG film 14 is resistant to moisture, making it possible to keep the terminal wire w1 from moisture. Moreover, the organic SOG film 14 is cut more easily than an inorganic film, allowing multiple display devices to be easily cut out in Step S10.

Second Embodiment

Figure 4:
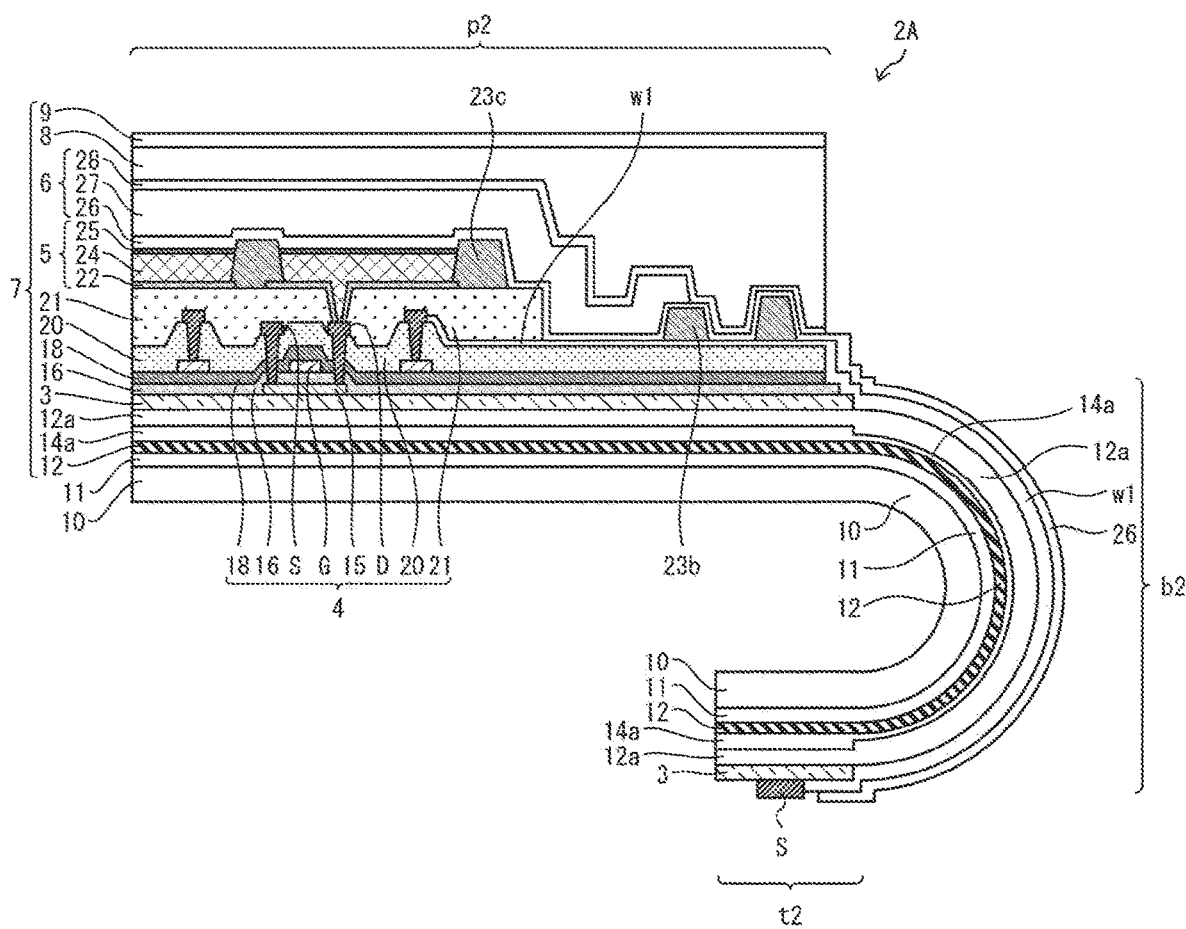
FIG. 4 is a cross-sectional view illustrating a configuration example of a display device according to a second embodiment of the disclosure.

FIG. 4 is a cross-sectional view illustrating a configuration example of a display device 2A according to a second embodiment of the disclosure. As illustrated in FIG. 4, the display device 2A is different from the display device 2 in that the organic SOG film 14 is replaced with an organic SOG film 14a.

The organic SOG film 14a includes a portion laid through a folding area b2 and another portion laid not through the folding area b2. Here, the portion is thinner than the other portion. Specifically, the portion, of the organic SOG film 14a, laid through the folding area b2 is thinner than portions, of the organic SOG film 14a, laid through a display area p2 and a terminal t2. In Step S1 of manufacturing the display device 2A, the organic SOG film 14a is partially formed thin in the folding area b2.

That is, the organic SOG film 14a has a thick portion laid through the display area p2, a thin portion laid through the folding area b2, and another thick portion laid through the terminal t2. When the folding area b2 is folded, such a feature makes it possible to further reduce the risk of a crack in the organic SOG film 14a than in the organic SOG film 14. Furthermore, the thick portions of the organic SOG film 14a are laid through the display area p2 and the terminal t2, making it possible to greatly keep the display area p2 and the terminal t2 from moisture.

Third Embodiment

Figure 5:
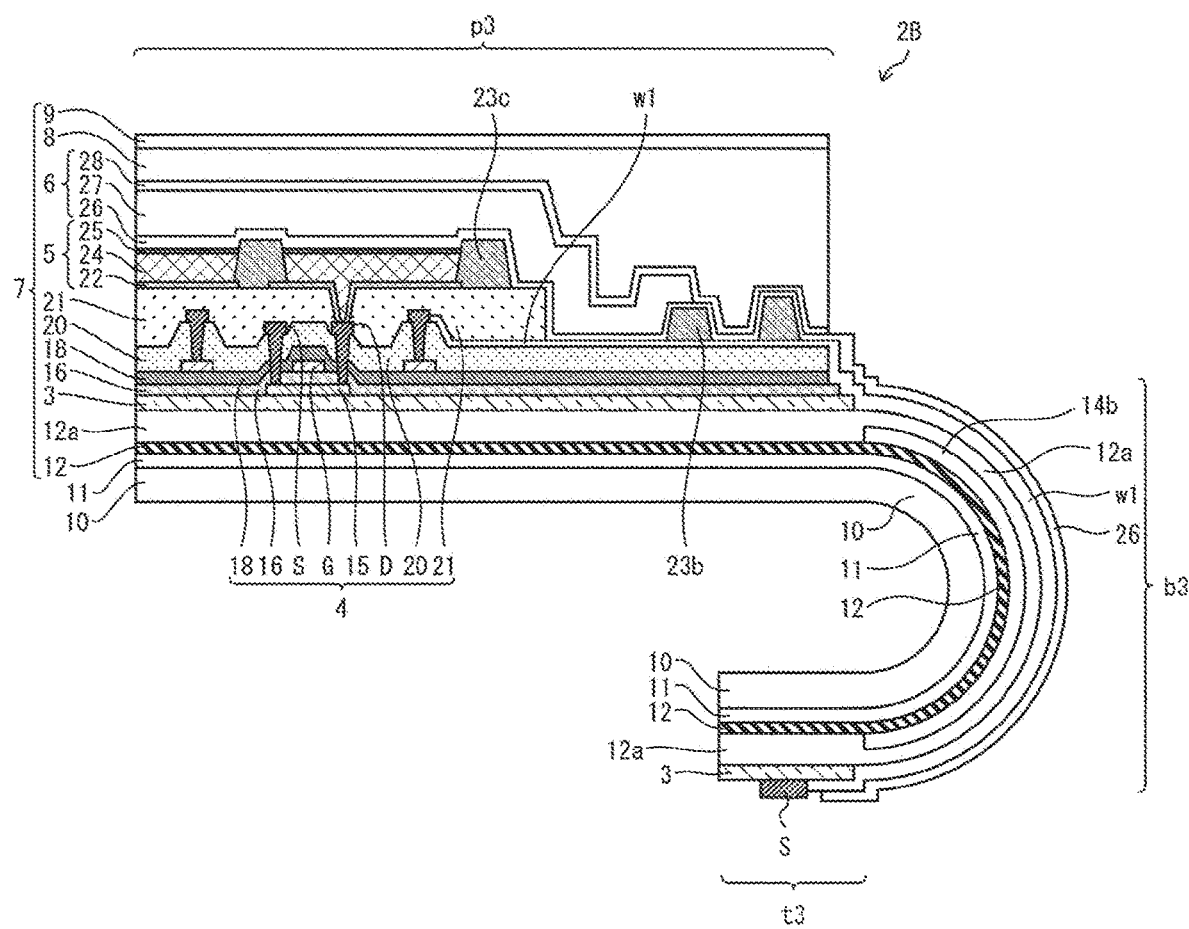
FIG. 5 is a cross-sectional view illustrating a configuration example of a display device according to a third embodiment of the disclosure.

FIG. 5 is a cross-sectional view illustrating a configuration example of a display device 2B according to a third embodiment of the disclosure. As illustrated in FIG. 5, the display device 2B is different from the display device 2 in that the organic SOG film 14 is replaced with an organic SOG film 14b.

The organic SOG film 14b is provided only in a folding area b3. That is, the organic SOG film 14b is not provided either in a display area p3 or a terminal t3, and extends only along the folding area b3. In other words, the organic SOG film 14b is laid not through the display area p3 and the terminal t3, but through the folding area b3. In Step 1 of manufacturing the display device 2B, the organic SOG film 14b is formed only in the folding area b3.

Hence, the organic SOG film 14b is provided only in the folding area b3. Compared with the case where the organic SOG film 14b is laid through all of the display area p3, the terminal t3, and the folding area b3, such a feature makes it possible to reduce the size of the organic SOG film 14b. Hence, the display device 2B can be manufactured at lower costs. Furthermore, the organic SOG film 14b often includes a siloxane-based material as a main component. Hence, the organic SOG film 14b could contain not a small amount of cyclic siloxane which would adversely affect the TFT layer 4 and the terminal t3. The organic SOG film 14b is provided only in the folding area b3, making it possible to keep the TFT layer 4 and the terminal t3 from adverse effects as much as possible. Moreover, the second resin layer 12a is formed to cover the organic SOG film 14b, making it possible to reduce the risk of future contamination of an apparatus to form the TFT layer 4, and adverse effects on characteristics of the TFT layer 4.

Figure 6:
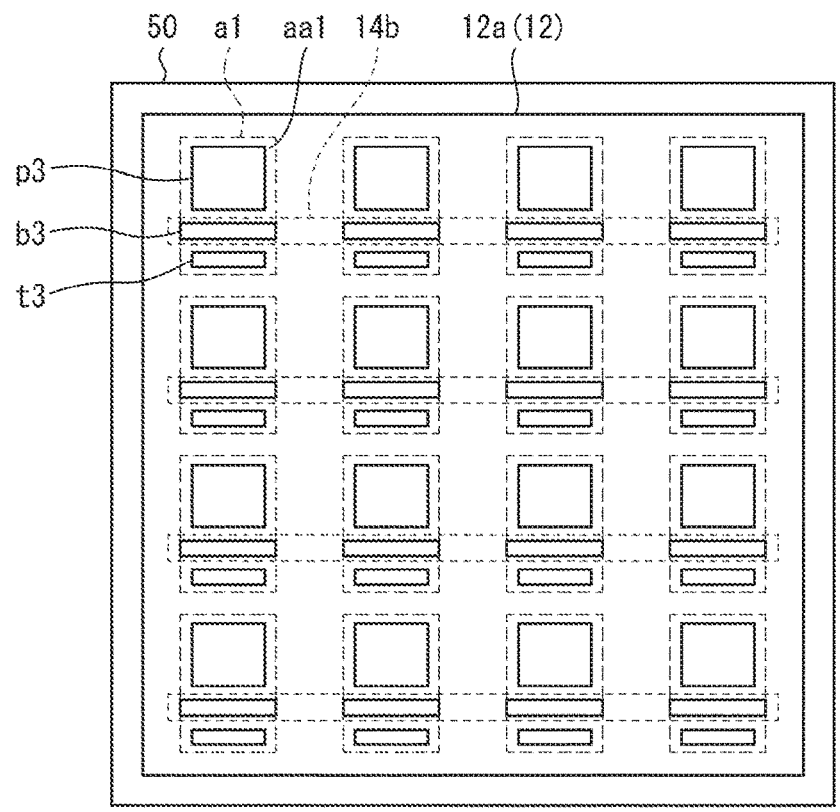
FIG. 6 is an illustration showing how to manufacture the display device illustrated in FIG. 5.

FIG. 6 is an illustration showing how to manufacture the display device 2B. As illustrated in FIG. 6, in manufacturing the display device 2B, the display area p3, the folding area b3, and the terminal t3 may be formed in an area surrounded by a dotted line a1 on the mother substrate 50. The area surrounded by the dotted line a1 may include two or more of such areas arranged at equal intervals on the mother substrate 50. The areas are cut out in the processing in Step S10 described before.

Hence, the display device 2B includes a frame area aa1 surrounding the display area p3. The frame area aa1 is an area surrounded by the dotted line a1 except the display area p3. The frame area aa1 includes: the terminal t3 formed at an end of the frame area aa1; and the folding area b3. Moreover, when observed from above, the organic SOG film 14b includes the folding area b3, and is formed to be positioned between the display area p3 and the terminal t3. As can be seen, the area surrounded by the dotted line a1 is cut out in the processing in S10 to form the frame area aa1 (forming a frame area).

Furthermore, the regions each surrounded by the corresponding dotted line a1 are arranged so that the folding areas b3, each included in the corresponding region surrounded by the dotted lines a1, are aligned in line. Such an arrangement makes it possible to include all the folding areas b3 aligned in line on a single organic SOG film 14b when observed from above as illustrated in FIG. 6.

Moreover, as illustrated in FIG. 6, the organic SOG film 14b is positioned not to overlap with either the display area p3 or the terminal t3 when observed from above. Hence, if the organic SOG film 14b contains not a small amount of cyclic siloxane, such positioning makes it possible to keep the TFT layer 4 and the terminal t3 from adverse effects as much as possible.

Note that, in FIG. 6, the organic SOG film 14b is formed between the first resin layer 12 and the second resin layer 12a, and includes the folding area b3 when observed from above. Specifically, when observed from above, the folding area b3 has an edge positioned more inward than an edge of the organic SOG film 14b.

Fourth Embodiment

Figure 7:
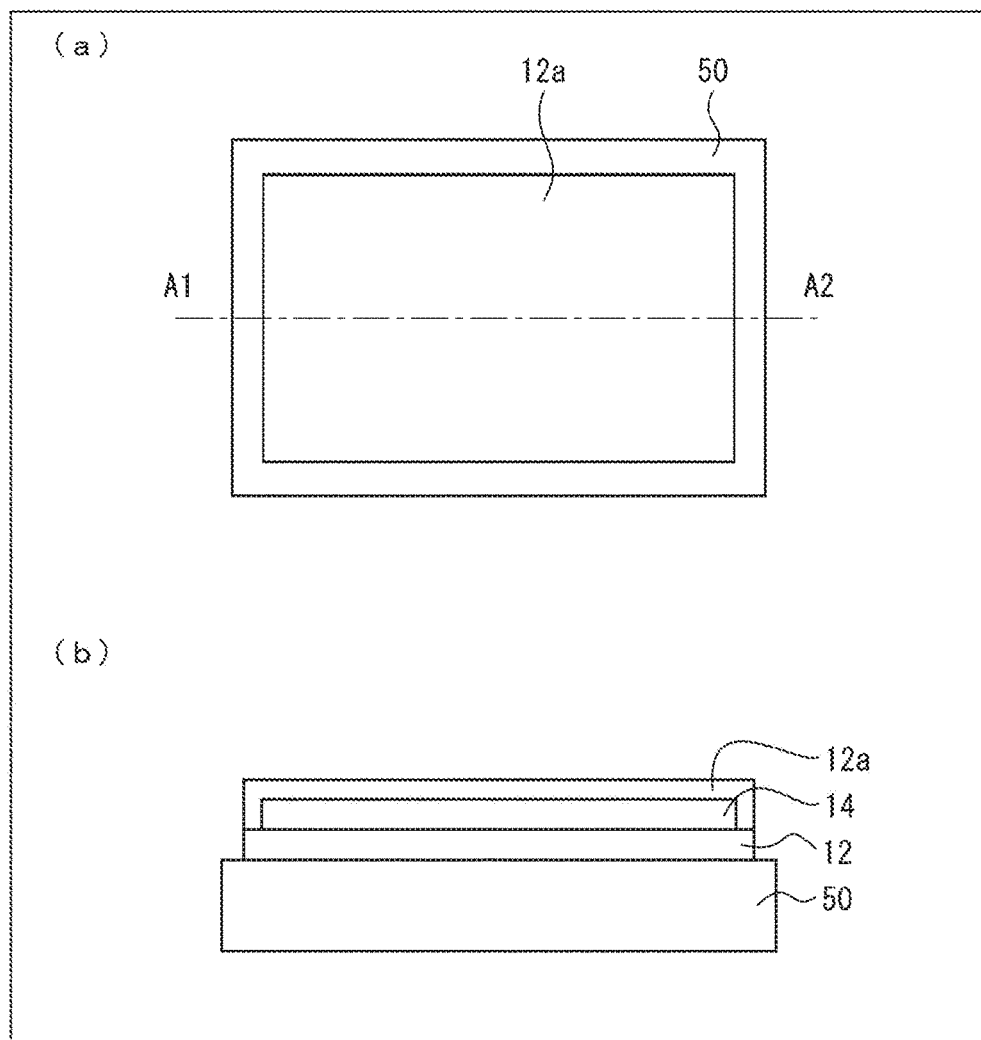
FIG. 7(a) is a cross-sectional view illustrating a step in which a resin layer and an organic SOG film are formed on a mother substrate in a method for manufacturing the display device according to a fourth embodiment of the disclosure.
FIG. 7(b) is a cross-sectional view cut by the line A1-A2 of FIG. 7(a).

FIG. 7(a) is a cross-sectional view illustrating a step in which a resin layer and the organic SOG film 14 are formed on the mother substrate 50 in a method for manufacturing the display device according to a fourth embodiment of the disclosure. FIG. 7(b) is a cross-sectional view cut by the line A1-A2 of FIG. 7(a).

As illustrated in FIG. 7(a) and FIG. 7(b), considered here is a case where, on the mother substrate 50, the first resin layer 12, the organic SOG film 14, and the second resin layer 12a are formed on top of another in the method (Step S1) for manufacturing the display device according to this embodiment. In this case, when observed from above, the organic SOG film 14 has an edge positioned more inward than edges of the first resin layer 12 and the second resin layer 12a. The edge of the organic SOG film 14 is covered with the first resin layer 12 and the second resin layer 12a.

Hence, the edge of the organic SOG film 14 is covered with the first resin layer 12 and the second resin layer 12a. Thus, when a plurality of display devices are cut out, for example, in Step 10, portions of the first resin layer 12 and the second resin layer 12a (not the organic SOG film 14) are cut out. Such a feature makes possible to easily cut out the display devices.

Figure 8:
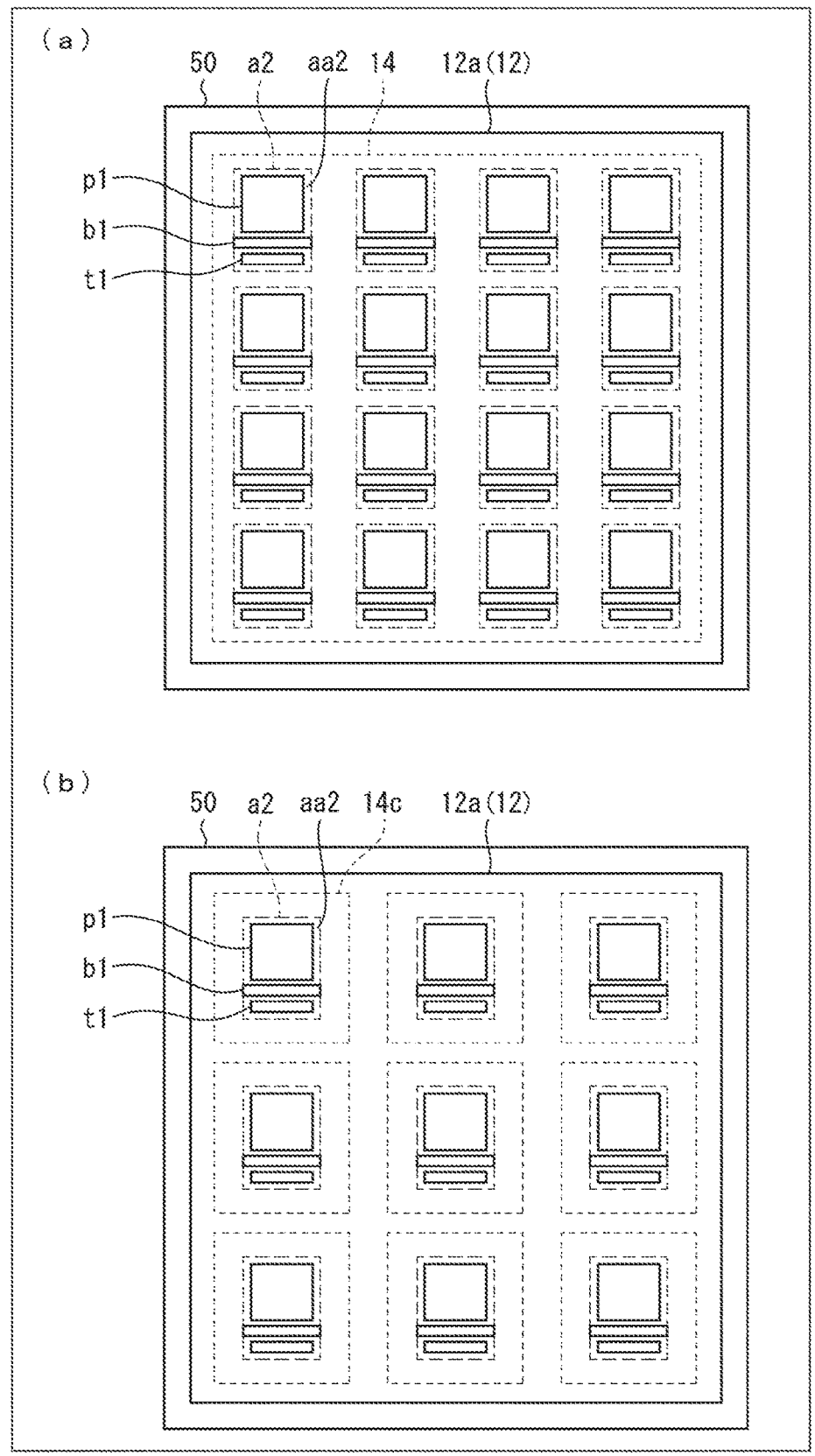
FIG. 8(a) and FIG. 8(b) are illustrations showing how to manufacture display devices according to the fourth embodiment of the disclosure.

FIG. 8(a) and FIG. 8(b) are illustrations showing how to manufacture display devices according to the fourth embodiment of the disclosure. As illustrated in FIG. 8(a), in manufacturing the display device, the display area p1, the folding area b1, and the terminal t1 may be formed in an area surrounded by a dotted line a2 on the mother substrate 50. Moreover, the area surrounded by the dotted line a2 may include two or more of such areas arranged at equal intervals on the mother substrate 50. The areas are cut out in the processing in Step S10 described before. Hence, the display device includes a frame area aa2 surrounding the display area p1. The frame area aa2 is an area surrounded by the dotted line a2 except the display area p1.

As illustrated in FIG. 8(a), the organic SOG film 14 may be applied on the first resin layer 12 to include all the areas surrounded by the dotted lines a2, when observed from above. Specifically, when observed from above, all the edges of the regions each surrounded by the corresponding dotted line a2 are positioned more inward than the edge of the organic film 14.

Furthermore, as illustrated in FIG. 8(b), the organic SOG film 14c may include a plurality of organic SOG films 14c to be applied on the first resin layer 12. In this case, each of the organic SOG films 14c may be applied on the first resin layer 12 to include an individual area surrounded by the corresponding dotted line a2, when observed from above. That is, one organic SOG film 14c includes one area surrounded by the dotted line a2 when observed from above. Moreover, when observed from above, an edge of one area surrounded by the dotted line a2 is positioned more inward than an edge of one organic SOG film 14.

Display Device

Note that the display device used in the embodiment may be any given display device including a flexible and bendable light-emitting device, and is not limited. The light-emitting device has brightness and transmittance controlled by current. An example of the light-emitting device to be controlled by current includes an organic electroluminescence (EL) display including an organic light-emitting diode (OLED), an EL display such as an inorganic EL display including an inorganic light-emitting diode, or a quantum dot light-emitting diode (QLED) display including a QLED.

Summary

A display device according to a first aspect of the disclosure includes a flexible support material on which a display area, a terminal, and a folding area are disposed, the display area including a TFT layer and a light-emitting device layer provided above the TFT layer, the folding area provided between the display area and the terminal; a first resin layer and a second resin layer extending along the display area, the terminal, and the folding area; and an organic SOG film provided between the first resin layer and the second resin layer, and laid through the folding area, wherein the second resin layer is provided above the first resin layer, and the TFT layer is provided above the second resin layer.

In the above features, the display device includes the organic SOG film provided between the first resin layer and the second resin layer, and laid through the folding area. Considered is, for example, a case where the folding area is folded so that the support material faces inward in the folded portion. In this case, the film provided between the first resin layer and the second resin layer is close to an inner side of the folded portion. Therefore, compared with an outer side of the folded portion, the film is subject to great force and is likely to crack.

Hence, the film to be provided between the first resin layer and the second resin layer is a flexible organic SOG film, thereby achieving the advantageous effects as follows. That is, when the folding area b1 is folded, the crack is prevented or reduced in the organic SOG film provided between the first resin layer and the second resin layer in the folding area.

Moreover, the features prevent or reduce a crack in the organic SOG film, making it possible to prevent or reduce stress to be applied to the terminal wire laid through the folding area. Hence, the terminal wire is kept from being broken, reducing generation of electromigration. The organic SOG film is resistant to moisture, making it possible to keep the terminal wire from moisture. Moreover, the organic SOG film is cut more easily than an inorganic film, allowing multiple display devices to be easily cut out.

In the display device of a second aspect of the disclosure according to the first aspect, the organic SOG film may extend along the display area, the terminal, and the folding area.

In the above feature, the organic SOG film extends along the display area, the terminal, and the folding area. This feature makes it possible to keep the display area, the terminal, and the folding entirely from moisture.

In the display device of a third aspect of the disclosure according to the second aspect, the organic SOG film may include: a portion laid through the folding area; and another portion laid not through the folding area, the portion being thinner than the other portion.

In the above feature, a portion, of the organic SOG film, laid through the folding area is thinner than the other portions, of the organic SOG film, not laid through the folding area. When the folding area is folded, such a feature makes it possible to further reduce the risk of a crack in the organic SOG film. Furthermore, the thick portions of the organic SOG film are laid through the display area and the terminal, making it possible to greatly keep the display area and the terminal from moisture.

The display device of a fourth aspect of the disclosure according to the first aspect may further include a frame area surrounding the display area, wherein the frame area may include: the terminal formed at an end of the frame area; and the folding area, and when observed from above, the organic SOG film may include the folding area, and may be formed to be positioned between the display area and the terminal.

In the above feature, the organic SOG includes the folding area to be positioned between the display area and the terminal. Thus, the organic SOG film is provided only in the folding area. Therefore, compared with the case where the organic SOG film is laid through all of the display area, the terminal, and the folding area, the feature makes it possible to reduce the size of the organic SOG film. Hence, the display device can be manufactured at lower costs.

In the display device of a fifth aspect of the disclosure, the organic SOG film may be positioned not to overlap with the display area when observed from above.

In the above feature, the organic SOG film does not overlap with the display area when observed from above. Hence, if the organic SOG film contains, for example, not a small amount of cyclic siloxane which would adversely affect the TFT layer, such a feature makes it possible to keep the TFT layer from adverse effects as much as possible because the organic SOG film does not overlap with the display area.

In the display device of a sixth aspect of the disclosure, the organic SOG film may be positioned not to overlap with the terminal when observed from above.

In the above feature, the organic SOG film does not overlap with the terminal when observed from above. Hence, if the organic SOG film contains, for example, not a small amount of cyclic siloxane which would adversely affect the terminal, such a feature makes it possible to keep the terminal from adverse effects as much as possible because the organic SOG film does not overlap with the terminal.

In the display device of a seventh aspect of the disclosure according to any one of the first to fourth aspects, when observed from above, the organic SOG film may have an edge positioned more inward than edges of the first resin layer and the second resin layer, and the edge of the organic SOG film may be covered with the first resin layer and the second resin layer.

In the above feature, the organic SOG film has an edge positioned more inward than edges of the first resin layer and the second resin layer. The edge of the organic SOG film is covered with the first resin layer and the second resin layer. Thus, when a plurality of display devices are cut out, for example, portions of the first resin layer and the second resin layer (not the organic SOG film) are cut out. Such a feature makes it possible to easily cut out the display devices.

A method for manufacturing a display device according to an eighth aspect of the disclosure, the display device including a flexible support material on which a display area, a terminal, and a folding area are disposed, the display area including a TFT layer and a light-emitting device layer provided above the TFT layer, the folding area provided between the display area and the terminal, and the method including: applying a first resin layer on a mother substrate; applying an organic SOG film on the first resin layer; applying a second resin layer on the organic SOG film; forming the TFT layer above the second resin layer; forming the light-emitting device layer above the TFT layer; removing the mother substrate from the first resin layer; and attaching the support material to the first resin layer, wherein the first resin layer and the second resin layer extend along the display area, the terminal, and the folding area, and the organic SOG film is applied to be laid through the folding area.

The method of a ninth aspect of the disclosure according to the eighth aspect may further include forming a frame area surrounding the display area, wherein the frame area may include: the terminal formed at an end of the frame area; and the folding area, and when observed from above, the organic SOG film is applied to be positioned between the display area and the terminal to include the folding area.

The disclosure shall not be limited to the embodiments described above, and can be modified in various manners within the scope of claims. The technical aspects disclosed in different embodiments are to be appropriately combined together to implement an embodiment. Such an embodiment shall be included within the technical scope of the disclosure. Moreover, the technical features disclosed in each embodiment are combined to achieve a new technical feature.

The invention claimed is:

1. A display device comprising:
   a flexible support material on which a display area, a terminal, and a folding area are disposed, the display area including a TFT layer and a light-emitting device layer provided above the TFT layer, the folding area provided between the display area and the terminal;
   a first resin layer and a second resin layer extending along the display area, the terminal, and the folding area; and
   an organic spin-on-glass (SOG) film provided between the first resin layer and the second resin layer, and laid through the folding area, wherein
   the second resin layer is provided above the first resin layer, and
   the TFT layer is provided above the second resin layer.

2. The display device according to claim 1, wherein the organic SOG film extends along the display area, the terminal, and the folding area.

3. The display device according to claim 2, wherein the organic SOG film includes: a portion laid through the folding area; and another portion laid not through the folding area, the portion being thinner than the other portion.

4. The display device according to claim 1, further comprising:
a frame area surrounding the display area, wherein
the frame area includes: the terminal formed at an end of the frame area; and the folding area, and
when observed from above, the organic SOG film includes the folding area, and is formed to be positioned between the display area and the terminal.

5. The display device according to claim 4, wherein when observed from above, the organic SOG film is positioned not to overlap with the display area.

6. The display device according to claim 4, wherein when observed from above, the organic SOG film is positioned not to overlap with the terminal.

7. The display device according to claim 1, wherein when observed from above, the organic SOG film has an edge positioned more inward than edges of the first resin layer and the second resin layer, and
the edge of the organic SOG film is covered with the first resin layer and the second resin layer.

8. A method for manufacturing a display device, the display device comprising: a flexible support material on which a display area, a terminal, and a folding area are disposed, the display area including a TFT layer and a light-emitting device layer provided above the TFT layer, the folding area provided between the display area and the terminal, and the method comprising:
applying a first resin layer on a mother substrate;
applying an organic SOG film on the first resin layer;
applying a second resin layer on the organic SOG film;
forming the TFT layer above the second resin layer;
forming the light-emitting device layer above the TFT layer;
removing the mother substrate from the first resin layer; and
attaching the support material to the first resin layer, wherein
the first resin layer and the second resin layer extend along the display area, the terminal, and the folding area, and
the organic SOG film is applied to be laid through the folding area.

9. The method according to claim 8, further comprising:
forming a frame area surrounding the display area, wherein
the frame area is formed to include the terminal formed at an end of the frame area; and the folding area, and
when observed from above, the organic SOG film is applied to be positioned between the display area and the terminal to include the folding area.

* * * * *